United States Patent
Yun

(10) Patent No.: US 8,513,048 B2
(45) Date of Patent: Aug. 20, 2013

(54) IMAGE SENSOR AND METHOD OF MANUFACTURING THE SAME

(75) Inventor: Young Je Yun, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 735 days.

(21) Appl. No.: 12/606,912

(22) Filed: Oct. 27, 2009

(65) Prior Publication Data

US 2010/0117177 A1    May 13, 2010

(30) Foreign Application Priority Data

Nov. 7, 2008    (KR) .................. 10-2008-0110194

(51) Int. Cl.
*H01L 31/0232*    (2006.01)
*H01L 31/18*    (2006.01)

(52) U.S. Cl.
USPC ................. 438/70; 257/432; 257/E31.127

(58) Field of Classification Search
USPC ...................................................... 257/432
See application file for complete search history.

(56) References Cited

U.S. PATENT DOCUMENTS

| 6,057,896 | A  | * | 5/2000 | Rho et al. .................. 349/42 |
| 7,569,804 | B2 |   | 8/2009 | Lim |
| 2006/0145223 | A1 | * | 7/2006 | Ryu ........................... 257/294 |
| 2007/0001252 | A1 | * | 1/2007 | Noda et al. .................. 257/432 |
| 2008/0150059 | A1 |   | 6/2008 | Yun |

FOREIGN PATENT DOCUMENTS

| KR | 10-2008-0020019 A | 3/2008 |
| KR | 10-0821475 B1 | 4/2008 |
| KR | 10-2008-0058549 A | 6/2008 |

OTHER PUBLICATIONS

Keun Hyuk Lim; "CMOS Image Sensor and a Method of Manufacturing the Same, Capable of Improving Color Reproducibility by Removing a Part of a Passivation Layer"; Korean Patent Abstracts; Publication No. 1020080020019 A; Publication Date: Mar. 5, 2008; Korean Intellectual Property Office, Republic of Korea.
Korean Office Action dated Sep. 17, 2010; Korean Patent Application No. 10-2008-0110194; 4 pages; Korean Intellectual Property Office, Republic of Korea.
Yun, Young Je, "Method for Forming Dielectric Layer in a Low Pressure Chemical Vapor Deposition Apparatus, Capable of Reducing a Process Progress Time by Performing a High Temperature Deposition Oxide Layer Process and a Nitride Layer Deposition Process in a Single Low Pressure Chemical Vapor Deposition Apparatus", Korean Patent Abstract Publication No. 1020080058549 A, Jun. 26, 2008.
Hyuk et al., "CMOS Image Sensor and Method for Manufacturing thereof", Abstract of Korean Patent Publication No. KR20080020019, http://worldwide.espacenet.com/, Mar. 5, 2008.

* cited by examiner

*Primary Examiner* — Jarrett Stark
*Assistant Examiner* — Lawrence Tynes, Jr.
(74) *Attorney, Agent, or Firm* — Adnrew D. Fortney

(57) ABSTRACT

An image sensor and a method of manufacturing the same are disclosed. A passivation layer on an interlayer dielectric layer has different thicknesses for neighboring pixels. Consequently, a phase of light incident on a pixel is out of phase with light incident on an adjacent pixel before it reaches a photodiode. As a result, diffraction of the incident light results in destructive interference between the pixels. Thus, cross talk between adjacent pixels can be prevented.

10 Claims, 6 Drawing Sheets

IMAGE SENSOR AND METHOD OF MANUFACTURING THE SAME

CROSS REFERENCE TO RELATED APPLICATION

This application claims the benefit of the Korean Patent Application No. 10-2008-0110194, filed on Nov. 7, 2008, which is hereby incorporated by reference as if fully set forth herein.

BACKGROUND OF THE DISCLOSURE

1. Field of the Disclosure

The present invention relates to a semiconductor device, more particularly, to an image sensor of a semiconductor device and a method of manufacturing the same.

2. Discussion of the Related Art

In general, image sensors are semiconductor devices that convert optical images into electrical signals.

An image sensor may be classified as a charge coupled device (CCD) image sensor or as a complementary metal oxide semiconductor (CMOS) image sensor.

CMOS image sensors include an integer multiple number of MOS transistors as the number of pixels. Using CMOS technology, a control circuit can be simultaneously integrated with signal processing circuits, which are peripheral circuits. Then, the CMOS image sensor switches to detect outputs.

Each CMOS image sensor pixel includes a photodiode and a plurality of MOS transistors, and it typically converts a light incident on an image sensor chip into an electrical signal.

In recent years, vertical image sensors have been developed and widely used. The vertical photodiodes provide the advantage of having a vertical photodiode that is able to detect various colors with a single pixel, in contrast to a horizontal image sensor structure.

A conventional CMOS image sensor is manufactured according to a following method.

At least one photodiode is formed on a substrate and a multilayered interlayer dielectric layer having metal lines therein is formed on the substrate having the photo diode formed thereon.

An oxide or nitride is then deposited on the interlayer dielectric layer to form a passivation layer. After at least one color filter layer corresponding to the photodiode is formed on the passivation layer, at least one microlens is formed on or over the color filter layer. The image sensor may also include a planarizing layer formed on or over the passivation layer.

The passivation layer of the image sensor manufactured through the conventional process described above is formed with substantially the same thickness in every pixel.

FIG. 1 is a diagram illustrating light incident on the conventional image sensor, as described above. FIGS. 2A and 2B are graphs illustrating profiles of an electric field and light intensity of the light incident on the conventional image sensor, respectively.

The size of image sensors, including the pixels, is progressively shrinking in the ULSI era. If the passivation layer is formed in every pixel with the identical thickness, as in the conventional image sensor, the phase of the light reaching the photodiodes of each pixel is identical.

That is, as shown in the profile of the electric field of FIG. 2A, light incident on neighboring pixels in the conventional image sensor have identical phases. As a result constructive interference of light between neighboring pixels occurs, as shown in the profile of the light intensity. The resulting constructive interference results in cross-talk between adjacent pixels, distorting the image data received by the image sensor.

Specifically, diffraction of the incident light deteriorates and/or distorts the profile of the light intensity, as shown in FIG. 2B. This phenomenon is especially pronounced in image sensors where the size or width of the light beam focused on the photodiode is larger than the size of the photodiode.

The cross talk of image data has become a problem as image sensor technology has become progressively miniaturized, resulting in smaller sized pixels and photodiodes. This phenomenon reduces the quality of the images produced by the image sensor.

SUMMARY OF THE DISCLOSURE

Accordingly, the present invention is directed to an image sensor and a method of manufacturing the same.

An object of the present invention is to provide an image sensor that is able to remove constructive interference generated between neighboring pixels in an image sensor by varying a thickness of a passivation layer between adjacent pixels and to prevent deterioration of a light intensity profile by manipulating the diffraction of incident light, and a method of manufacturing such an image sensor.

Another object of the present invention is to provide an image sensor that is able to minimize cross talk between adjacent pixels by varying the thickness of the passivation layer between adjacent pixels.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, a method of manufacturing an image sensor includes forming an interlayer dielectric layer having a plurality of metal lines therein on a substrate having a photodiode therein; forming a passivation layer having a crenellated or stepped cross-sectional profile on the interlayer dielectric layer, where the thickness of a first portion of the passivation layer on a first pixel is greater than the thickness of a second portion of the passivation layer on an adjacent pixel; forming a color filter layer on the stepped or crenellated passivation layer, the color filter layer having an uneven surface due to the stepped or crenellated passivation layer; planarizing the uneven surface of the color filter layer; and forming microlenses on the planarized color filter layer.

In another aspect of the present invention, a method of manufacturing an image sensor includes forming an interlayer dielectric layer having a plurality of metal lines therein on a substrate having a photodiode therein; forming a passivation layer having a stepped or crenellated cross-sectional profile on the interlayer dielectric layer, where the thickness of a first portion the passivation layer on or over a first pixel is greater than the thickness of a second portion of the passivation layer on or over an adjacent pixel; forming a color filter layer on the stepped or crenellated passivation layer; forming a planarization layer on or over the color filter layer; forming microlenses on or over the planarization layer.

In a further aspect of the present invention, an image sensor includes a substrate having a photodiode therein; an interlayer dielectric layer on or over the substrate, the interlayer dielectric layer having a plurality of metal lines therein; a passivation layer having a stepped or crenellated cross-sectional profile on or over the interlayer dielectric layer, where the thickness of a first portion the passivation layer on or over a first pixel is greater than the thickness of a second portion of the passivation layer on or over an adjacent pixel; a color filter layer on or over the passivation layer, the color filter layer having a planar top surface; and microlenses on or over the color filter layer.

In a still further aspect of the present invention, an image sensor includes a substrate having a photodiode therein; an interlayer dielectric layer on the substrate, the interlayer dielectric layer having a plurality of metal lines therein; a passivation layer having a stepped or crenellated profile on the interlayer dielectric layer, where the thickness of a first portion of the passivation layer on or over a first pixel is greater than the thickness of a second portion of the passivation layer on or over an adjacent pixel; a color filter layer on or over the passivation layer; a planarization layer on or over the color filter layer; and microlenses on or over the planarization layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

As follows, in reference to the accompanying drawings, an image sensor and a method of manufacturing the same according to exemplary embodiments of the present invention will be described.

Figure 4:
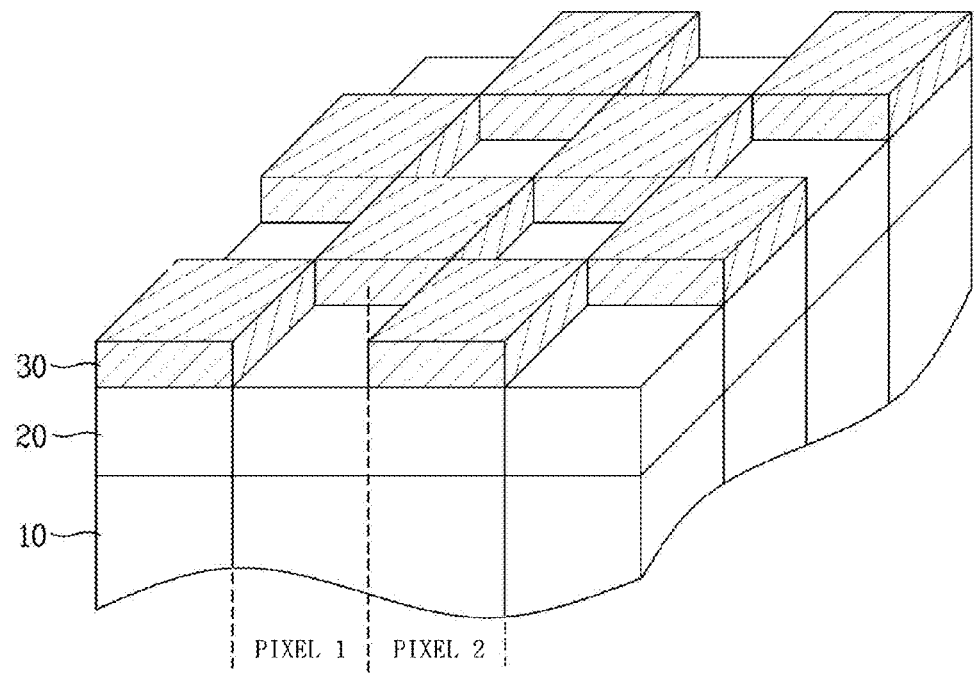
FIG. 4 is a diagram illustrating a photoresist pattern for etching a passivation layer according to the present invention.
Figure 5A:
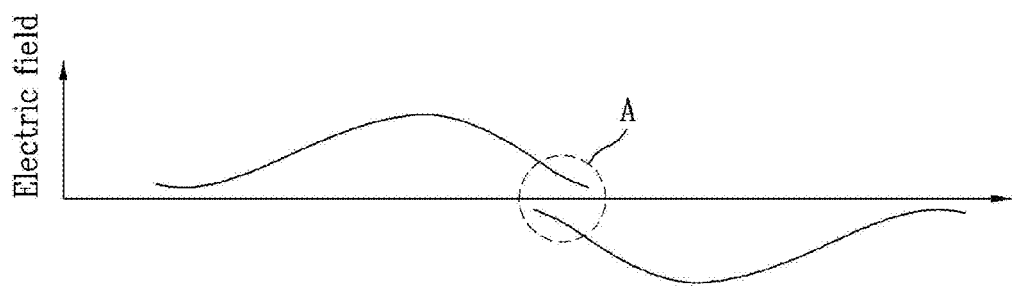
FIGS. 5A and 5B are graphs illustrating profiles of an electric field and light intensity resulting from light incident on the image sensor according to the present invention, respectively.
Figure 5B:

FIGS. 3A to 3D are sectional views illustrating processes of manufacturing an image sensor according to exemplary embodiments of the present invention. The image sensor(s) according to the embodiments of the present invention may be CMOS image sensor(s). FIG. 4 is a diagram illustrating a photoresist pattern for etching a passivation layer according to the present invention. FIGS. 5A and 5B are graphs illustrating profiles of an electrical field and light intensity, respectively, resulting from a light incident on an image sensor according to the present invention.

Figure 1:
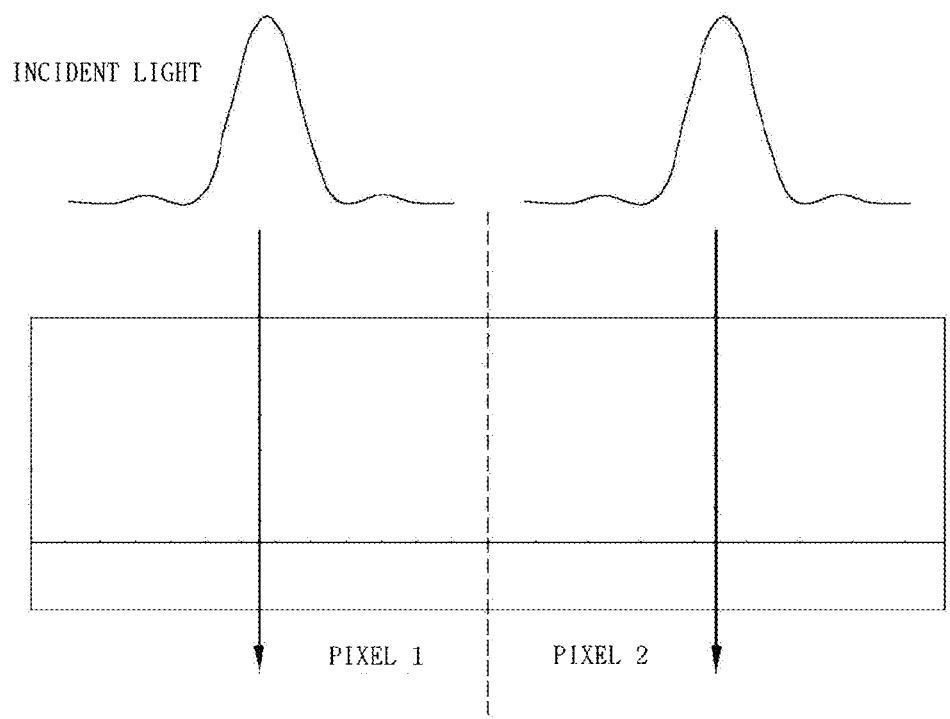
FIG. 1 is a diagram illustrating light incident on a conventional image sensor structure.
Figure 2A:
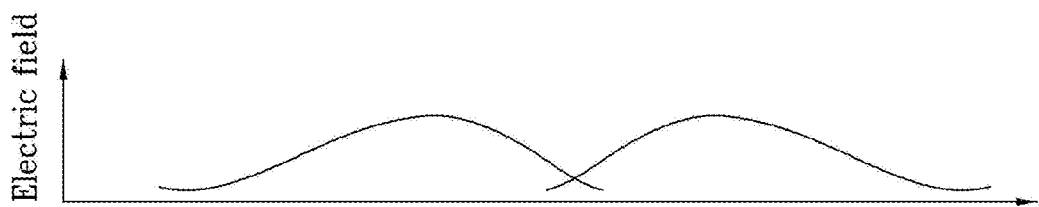
FIGS. 2A and 2B are graphs illustrating profiles of electric field and light intensity resulting from light incident on the conventional image sensor of FIG. 1, respectively.
Figure 2B:
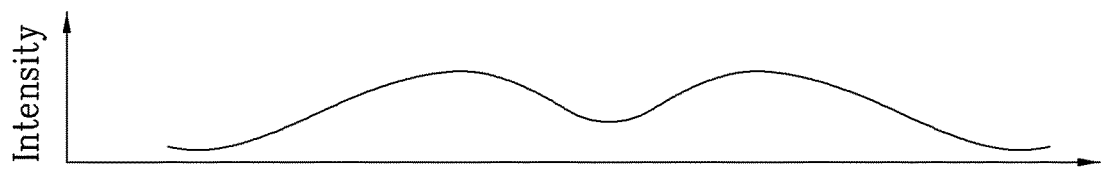
Figure 3A:
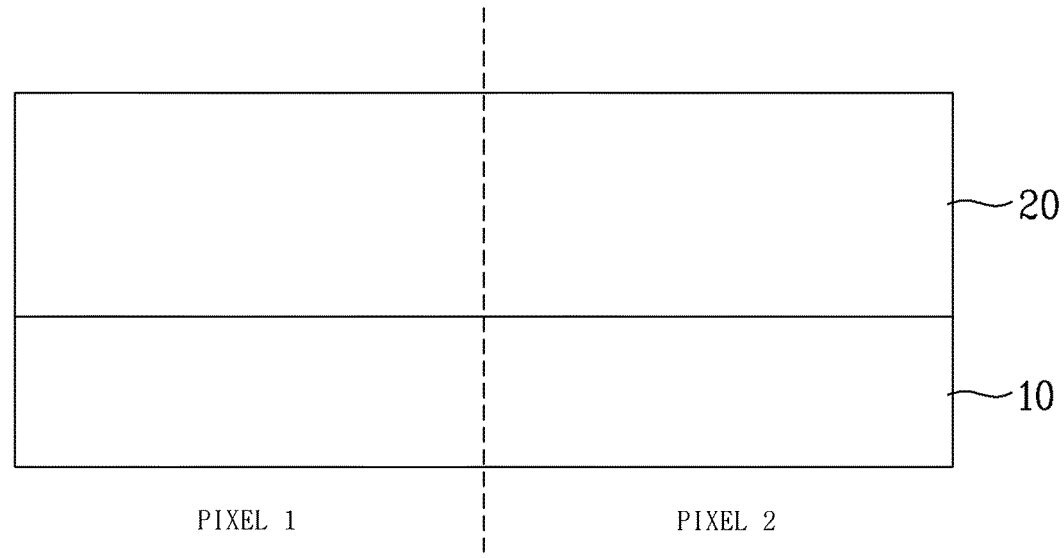
FIGS. 3A to 3D are cross-sectional views illustrating a method of manufacturing an image sensor according to an exemplary embodiment of the present invention.

As shown in FIG. 3A, an interlayer dielectric layer 10 having a plurality of metal lines therein may be formed on a substrate. The interlayer dielectric layer 10 may comprise multiple dielectric layers, each having one or more metal lines formed therein by photolithographically patterning the dielectric layer, depositing metal therein, and planarizing the metal deposited on the uppermost surface of the dielectric layer by chemical mechanical polishing (CMP). Alternatively, each dielectric layer in interlayer dielectric layer 10 can having one or more metal lines formed thereon depositing metal on the dielectric layer, then photolithographically patterning the metal layer.

The dielectric layers may comprise silicon dioxide (e.g., formed by chemical vapor deposition [CVD] of TEOS), silicon dioxide doped with (i) fluorine or (ii) boron and/or phosphorous, silicon oxycarbide (SiOC), hydrogenated silicon oxycarbide (SiOCH), or spin on glass (SOG). A pre-passivation layer 20 of silicon nitride (e.g., deposited by a physical vapor deposition [PVD] process, such as sputtering, or a CVD process such as plasma enhanced CVD or low pressure CVD) is formed on the interlayer dielectric layer 10. Alternatively, the passivation layer 20 may comprise a polyimide or other organic passivation material. Here, the substrate (generally a single-crystal silicon wafer, optionally with one or more layers of epitaxial silicon grown thereon) may include a photodiode formed therein (e.g., by implanting N-type ions into the silicon wafer and/or epitaxial layer[s]) and the interlayer dielectric layer 10.

Figure 3B:
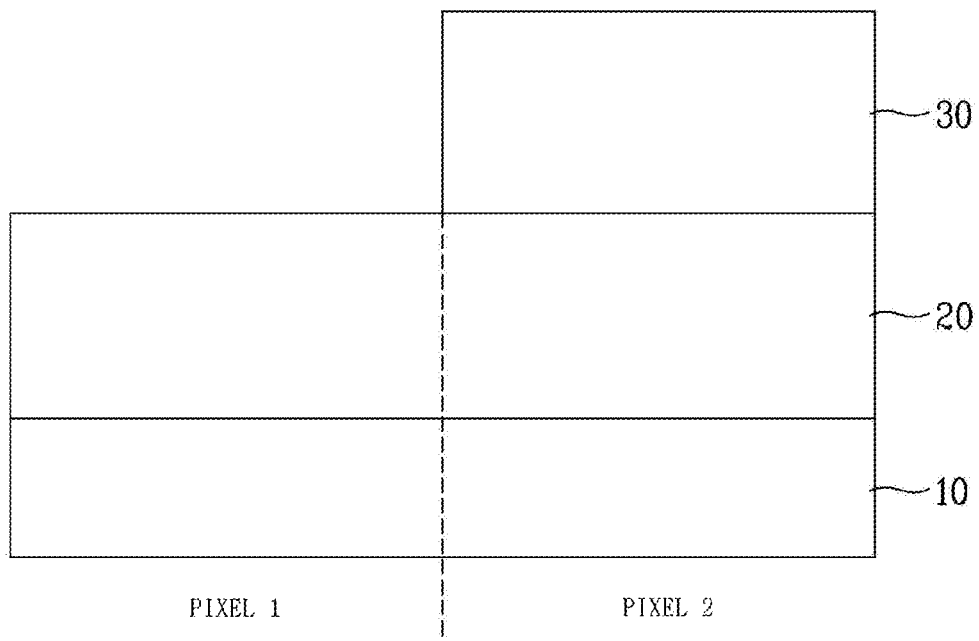

As shown in FIG. 3B, a photoresist (e.g., a negative or positive photoresist material) is coated on the pre-passivation layer 20, and the photoresist is patterned in exposure and development processes. As shown in FIG. 4, the patterned photoresist has a checkerboard pattern, where the photoresist is removed in an alternating pattern. Specifically, the photoresist is removed in a repeating pattern in which the photoresist is removed from one pixel, and remains on an adjacent pixel. For example, as shown in FIG. 3B, the portion of the photoresist coated on Pixel 1 is removed and a photoresist pattern 30 remains on adjacent Pixel 2. When the pixel has four sides as shown in FIG. 4, the photoresist pattern 30 can remain on a first pixel, but be removed from each of the four adjacent pixels at each side of the first pixel, or vice versa. The photoresist pattern 30 has a stepped or crenellated cross-sectional profile, where the photoresist is removed from one of two neighboring pixels and the photoresist pattern 30 remains on the adjacent pixel.

Subsequently, referring back to FIG. 3B, an exposed area of the pre-passivation layer 20 (the portions of the pre-passivation layer 20 that are formed over pixels from which the photoresist has been removed, such a Pixel 1) is etched to a predetermined depth using the photoresist pattern 30 as a mask, as shown in FIG. 4. The exposed areas of the pre-passivation layer 20 are generally dry etched or plasma-etched (e.g., by reactive ion etching). Thus, the portions of the pre-passivation layer 20 that were masked by photoresist pattern 30 remain substantially intact, while the exposed portions of pre-passivation layer 20 are etched to a predetermined depth. The depth of the etching process can be controlled by controlling the length of time of the etching process or by monitoring the interference pattern of light reflected from the surface of an etched area of passivation layer 20 and the underlying dielectric layer 10.

Figure 3C:
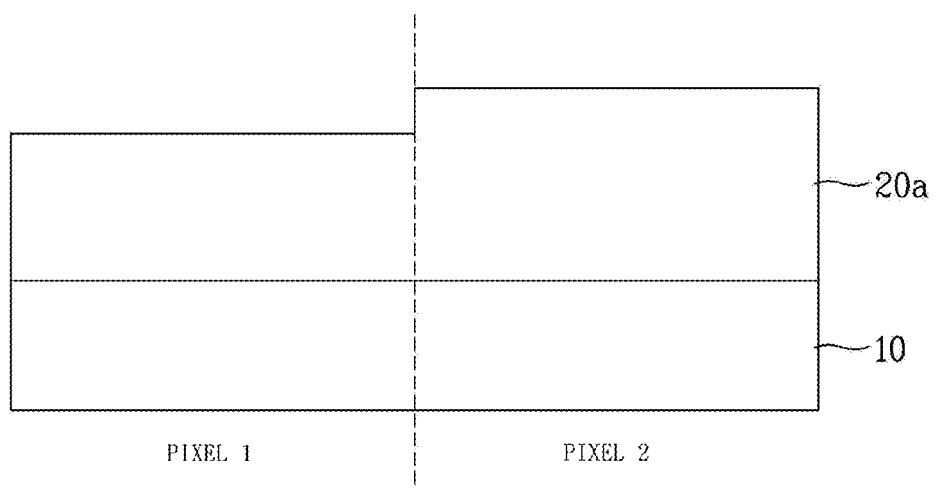

FIG. 3C provides a cross-sectional view of the etched passivation layer 20a. The stepped or crenellated cross-sectional pattern of the photoresist pattern 30 is translated to the etched passivation layer 20a, where there is a raised portion (e.g., a step) of the etched passivation layer 20 over every other pixel in any given row of pixels. Thus, from a top down view, the etched passivation layer 20 would have a checkerboard appearance similar to the photoresist pattern 30 shown in FIG. 4.

When etching the exposed area of the pre-passivation layer 20, the etching depth is predetermined based on a preferred phase difference between light reaching the photodiodes of neighboring Pixel 1 and Pixel 2. The etching depth of the portion of the etched passivation layer 20a over Pixel 1 is predetermined in order to cause a phase of light incident on Pixel 1 to be partially or substantially completely out of phase with respect to the phase of light incident on Pixel 2.

As a result, the exposed area of the pre-passivation layer 20 corresponding to Pixel 1 is etched to the predetermined depth, such that the phase of light incident on Pixel 1 may be shifted with respect to the phase of light incident on Pixel 2 adjacent to Pixel 1 before being transmitted to a photodiode in Pixel 1.

The exposed area of pre-passivation layer 20 (e.g., the portion of pre-passivation layer 20 over Pixel 1) may be etched to a thickness that results in a difference of about 180° (or close to 180°; e.g., >90°, ≧120°, ≧150°, etc.) between the light transmitted to a photodiode in Pixel 1 and the light transmitted to a photodiode in Pixel 2. The different thicknesses of the different portions of the etched passivation layer 20a over the two neighboring pixels generates a phase shift in the light incident on Pixel 2 relative to the light incident on Pixel 1, resulting in destructive interference at the pixel edge area where the two neighboring pixels meet. Thus, the constructive interference that causes cross-talk between adjacent pixels in a conventional image sensor can be prevented.

Specifically, as shown in the profile of the electric field shown in FIG. 5A, the phases of the two neighboring pixels (e.g., Pixels 1 and 2) are out of phase with respect to one another. That is, the phase of the light incident on Pixel 2 adjacent to Pixel 1 is about 180° with respect to the phase of the light incident on Pixel 1 (i.e., they are substantially in antiphase).

As shown in the profile of the light intensity shown in FIG. 5B, destructive interference is generated in the edge area between two neighboring pixels (e.g., Pixel 1 and Pixel 2). This destructive interference can prevent an optical diffraction phenomenon at the edge area between neighboring pixels that results in constructive interference between the light incident on the neighboring pixels. The destructive interference can also prevent deterioration of a light intensity profile in an image sensor device having a photodiode that is smaller than the size of the area of the light focused thereon.

The processes shown in FIG. 3B (photoresist patterning) and FIG. 3C (partial etching) can be repeated for half of the pixels having an etched portion of passivation layer 20a thereover (e.g., Pixel 1 in FIGS. 3C and 4) or half of the pixels having an unetched portion of passivation layer 20a thereover (e.g., Pixel 2 in FIGS. 3C and 4) to create a second etched portion of passivation layer 20a having a third thickness. Such an embodiment can be useful in a 3-color image sensor system (e.g., wherein a first group of pixels are configured to detect a red color, a second group of pixels are configured to detect a green color, and a third group of pixels are configured to detect a blue color). Such a second etched portion of passivation layer 20a can include portions of passivation layer 20a over pixels along a diagonal line in the array. For example, in FIG. 4, the photoresist pattern 30 can include portions masking Pixel 2 and other masked pixels as shown, plus all of the pixels along the diagonal from the near right-hand corner to the far left-hand corner of the array as shown.

Subsequently, color filter layers 40 and 41 and microlenses 60 may be sequentially formed on the stepped or crenellated passivation layer 20a.

Figure 3D:
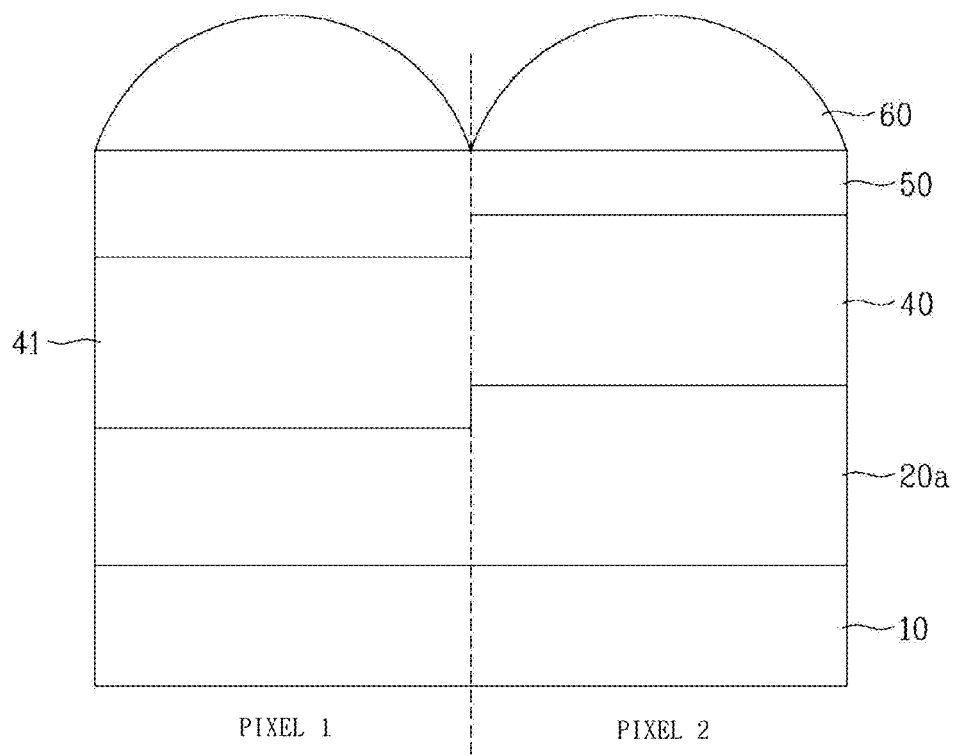

An exemplary process for forming the color filter layers 40 and 41 and the microlenses 60 will be described in reference to FIG. 3D.

The color filter layers 40 and 41 are formed on the stepped or crenellated passivation layer 20a, with a relatively uniform thickness over all of the pixels in the image sensor. However, because of the steps of the passivation layer 20a between adjacent pixels, a step or curvature is generated between the color filter layer 41 formed on Pixel 1 and the color filter layer 40 formed on Pixel 2.

A planarization layer 50 is formed on the color filter layers 40 and 41 to compensate for the step or curvature and to form a planar surface. The planarization layer 50 may comprise silicon dioxide (e.g., a CVD TEOS-based oxide as described herein or a spin-on glass [SOG]), which after deposition may be planarized by CMP. Thereafter, the microlenses 50 are formed on or over the planarization layer 50.

An alternative process for forming the color filter layers 40 and 41 and the microlenses 60 is described below. The color filter layers 40 and 41 are formed on the stepped or crenellated passivation layer 20a, as described above. However, the curvature or step generated between the color filter layer 41 formed on Pixel 1 and the color filter 40 formed on the Pixel 2 is removed by planarizing the color filter layers 40 and 41 (e.g., by chemical mechanical polishing [CMP]) or by depositing thickness of color filter layers 40 and 41 such that the total thickness of color filter layer 40 and the unetched portion of passivation layer 20a is about equal to the total thickness of color filter layer 41 and the etched portion of passivation layer 20a. The microlenses 60 may then be formed on or over the planarized color filter layers 40 and 41.

Referring to FIG. 3D, the image sensor manufactured by the processes explained above in reference to FIGS. 3A to 3D will be described.

The image sensor includes the interlayer dielectric layer 10 having a plurality of metal lines therein (not shown). The interlayer dielectric layer 10 is on or over the substrate and may be multi-layered with a metal line layer (not shown) on or in each layer of the dielectric layer 10.

The image sensor also includes the passivation layer 20a on or over the interlayer dielectric layer 10. Portions of the passivation layer 20a formed over neighboring pixels (e.g., Pixel 1 and Pixel 2) have different thicknesses, as explained above. The passivation layer 20a may comprise silicon nitride. Alternatively, the passivation layer 20a may comprise a SOG, polyimide, or other organic passivation material.

Because the thickness of the passivation layer 20a is different with respect to neighboring pixels, there is a step between neighboring pixels due to the stepped or crenellated cross-sectional etch profile of passivation layer 20a.

The overall structure of the passivation layer 20a can be explained in reference to adjacent Pixels 1 and 2. The passivation layer 20a includes a first area over Pixel 1 having a first thickness and a second area over Pixel 2 having a second thickness that is substantially greater than the first thickness. Here, the crenellated pattern resulting from the different thicknesses of the passivation layer 20a of the first area over Pixel 1 and the second area over Pixel 2 may be repeated for the entire image sensor. The thickness of the passivation layer 20a provided for the two neighboring pixels may be predetermined based on a following method.

For example, the first and second thicknesses may be predetermined in order to shift the phase of the light incident on Pixel 2 with respect to the phase of the light incident on Pixel 1. Especially, since the second area is etched, the etching thickness is adjusted for the second thickness to be the shifted (or reversed) phase for the two pixels.

More specifically, the first and second thicknesses are predetermined in order that light incident on Pixel 1 (e.g., striking the thinner first area of the passivation layer 20a) is phase shifted (e.g., by about 180°) with regard to light incident on Pixel 2 (e.g., striking the thicker second area of the passivation layer 20a). As a result, the light transmitted to a photodiode in Pixel 1 is out of phase with light transmitted to a photodiode in Pixel 2. Preferably, the phase difference between Pixel 1 and Pixel 2 is about 180° (i.e., the light transmitted to a photodiode in Pixel 1 is in substantially in antiphase with the light transmitted to a photodiode in Pixel 2).

The color filter layer 40 and 41 and the microlenses 60 are on or over the crenellated passivation layer 20a. For example, the color filter layers 40 and 41 provided on or over the crenellated passivation layer 20a may have planar top surfaces. As a result, the color filter layers 40 and 41 in the two pixels may have different thicknesses because of the varying thickness of the underlying passivation layer 20a. The microlenses 60 are on or over the color filters 40 and 41.

According to another example, the color filter layers 40 and 41 provided on the crenellated passivation layer 20a may have a substantially uniform thickness over every pixel in the image sensor. In such embodiments, the crenellated cross-sectional profile of the passivation layer 20a is translated to the color filter layers 40 and 41. A planarization layer is on or over the color filter layers 40 and 41 to compensate for the steps between color filter layers 40 and 41. Microlenses 60 are on or over the planarization layer 50.

In one embodiment, the color filter layers 40 and 41 may be arranged in a Bayer color filter array. As a result, the color filter includes red, green and blue filters. It is preferable that the green filter is provided on the first area of the passivation layer 20a over Pixel 1 having the smaller thickness.

According to the present invention, the passivation layer formed over a pixel array has different thicknesses for neighboring pixels. As a result, constructive interference generated between the two neighboring pixels may be prevented. The phases of light incident on two neighboring pixels are phase shifted with respect to each other before the light is transmitted to photodiodes in the respective pixels. As result, deterioration of the light intensity profile generated by a diffraction phenomenon of the incident light may be prevented. That is, destructive interference generated between the adjacent pixels prevents the diffraction phenomenon because the phases of the light incident on the adjacent pixels are substantially in antiphase before the light is transmitted to the photo diode.

Furthermore, the presently described image sensor may prevent cross talk between adjacent pixels, even in the miniaturized image sensors of the ULSI era.

Accordingly, the image sensor according to the present invention may improve overall quality of the image sensor.

It will be apparent to those skilled in the art that various modifications and variations can be made in the present invention without departing from the spirit or scope of the invention. Thus, it is intended that the present invention covers modifications and variations of the invention provided they come within the scope of the appended claims and their equivalents.

What is claimed is:

1. A method of manufacturing an image sensor comprising:
   forming an interlayer dielectric layer having a plurality of metal lines therein on a substrate having a photodiode therein;
   forming a pre-passivation layer on the interlayer dielectric layer;
   coating a photoresist on the pre-passivation layer;
   patterning the photoresist in a checkerboard pattern by removing the photoresist from alternating pixels;
   etching exposed areas of the pre-passivation layer using the photoresist pattern as a mask;
   forming a passivation layer on the interlayer dielectric layer, the passivation layer having a first thickness over a first pixel, a second thickness over a second pixel adjacent to the first pixel, and a step between the first and second pixels;
   forming a color filter layer on the passivation layer; and
   forming microlenses on the color filter layer.

2. The method of claim 1, wherein the color filter layer has a step or a curvature resulting from the step of the passivation layer, and the method further comprises planarizing the color filter layer prior to forming the microlenses.

3. The method of claim 1, wherein a phase of light incident on a first pixel is out of phase with a phase of light incident on the adjacent pixels.

4. The method of claim 3, wherein the exposed area is etched to a predetermined depth that results in a phase difference of about 180° with respect to the light incident on the masked pixels.

5. The method of claim 1, comprising forming the pre-passivation layer by physical vapor deposition or chemical vapor deposition.

6. A method of manufacturing an image sensor comprising:
   forming an interlayer dielectric layer having a plurality of metal lines therein on a substrate having a photodiode therein;
   forming a pre-passivation layer on the interlayer dielectric layer;
   coating a photoresist on the pre-passivation layer;
   forming a checkerboard-shaped photoresist pattern from the photoresist by patterning and removing the photoresist from alternating pixels;
   etching exposed areas of the pre-passivation layer using the photoresist pattern as a mask;
   forming a passivation layer on the interlayer dielectric layer, the passivation layer having a first thickness over a first pixel, a second thickness over a second pixel adjacent to the first pixel, and a step between neighboring pixels;
   forming a color filter layer on the passivation layer;
   forming a planarization layer on the color filter layer; and
   forming microlenses on the planarization layer.

7. The method of claim 6, wherein the color filter layer has a uniform thickness.

8. The method of claim 6, wherein a phase of light incident on a first pixel is out of phase with a phase of light incident on the adjacent pixels.

9. The method of claim 6, wherein the exposed areas are etched to a predetermined depth that results in a phase difference of 180° with respect to the light incident on the masked pixels and the light incident on the second pixel.

10. The method of claim 6, wherein the exposed areas of the pre-passivation layer are etched by dry etching or plasma etching.

* * * * *